United States Patent
Pillans et al.

(10) Patent No.: US 9,603,283 B1
(45) Date of Patent: Mar. 21, 2017

(54) ELECTRONIC MODULE WITH FREE-FORMED SELF-SUPPORTED VERTICAL INTERCONNECTS

(71) Applicant: Raytheon Company, Waltham, MA (US)

(72) Inventors: Brandon W. Pillans, Plano, TX (US); James Mcspadden, Allen, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/879,191

(22) Filed: Oct. 9, 2015

(51) Int. Cl.
    *H01L 21/00*    (2006.01)
    *H05K 7/20*     (2006.01)
    *H05K 13/00*    (2006.01)

(52) U.S. Cl.
    CPC .......... *H05K 7/202* (2013.01); *H05K 13/0023* (2013.01)

(58) Field of Classification Search
    CPC ....... H01L 2924/00; H01L 2924/00014; H01L 2224/48091; H01L 2924/0002; H01L 2924/07802; H01L 2924/10253; H01L 2924/14; H01L 2224/05599; H01L 21/50; H01L 2224/45124; H01L 2224/73265; H01L 23/04
    USPC .................. 257/E21.499, E23.103, E23.181, 257/E23.189, E23.19, E23.193; 438/107, 438/121, 125
    See application file for complete search history.

(56) References Cited

U.S. PATENT DOCUMENTS

| | | | |
|---|---|---|---|
| 4,733,293 A | 3/1988 | Gabuzda | |
| 4,868,712 A | 9/1989 | Woodman | |
| 5,403,784 A | 4/1995 | Hashemi et al. | |
| 5,450,283 A | 9/1995 | Lin et al. | |
| 5,847,929 A | 12/1998 | Bernier et al. | |
| 5,874,321 A * | 2/1999 | Templeton, Jr. | ........ H01L 21/50 257/E21.499 |

(Continued)

FOREIGN PATENT DOCUMENTS

| JP | 2004 228375 A | 8/2004 |
|---|---|---|
| WO | 2014209994 A2 | 12/2014 |

OTHER PUBLICATIONS

International Search Report and Written Opinion, dated Nov. 4, 2016, for corresponding International Patent Application No. PCT/US2016/045775.

*Primary Examiner* — Stephen W Smoot
*Assistant Examiner* — Edward Chin
(74) *Attorney, Agent, or Firm* — Renner, Otto, Boisselle & Sklar, LLP (57) ABSTRACT

An electronic module, and method for making same, includes free-formed, self-supported interconnect pillars that electrically connect cover electronic components disposed on a cover substrate with base electronic components disposed on a base substrate. The free-formed, self-supported interconnect pillars may extend vertically in a straight path between the cover electronic components and the base electronic components. The free-formed, self-supported interconnect pillars may be formed from an electrically conductive filament provided by an additive manufacturing process. By free-forming the self-supported interconnect pillars directly on the electronic components, the flexibility of electronic module design may be enhanced, while reducing the complexity and cost to manufacture such electronic modules.

15 Claims, 4 Drawing Sheets

(56) References Cited

U.S. PATENT DOCUMENTS

| | | | |
|---|---|---|---|
| 6,002,177 | A | 12/1999 | Gaynes et al. |
| 6,753,602 | B2 | 6/2004 | Wu |
| 7,642,128 | B1 | 1/2010 | Lin et al. |
| 7,675,154 | B2 | 3/2010 | Hong et al. |
| 8,283,205 | B2 | 10/2012 | Pagaila et al. |
| 8,354,740 | B2 | 1/2013 | Liu et al. |
| 8,519,520 | B2 | 8/2013 | Gong et al. |
| 8,659,153 | B2 | 2/2014 | Fay et al. |
| 8,963,135 | B2 | 2/2015 | Nikonov et al. |
| 9,385,095 | B2 * | 7/2016 | Jeng ............... H01L 23/3128 |
| 2004/0238934 | A1 | 12/2004 | Warner et al. |
| 2005/0090091 | A1 | 4/2005 | Ishikawa et al. |
| 2009/0014890 | A1 | 1/2009 | Takahashi |
| 2010/0215856 | A1 * | 8/2010 | Kritchman ......... B29C 67/0059 427/277 |
| 2012/0286407 | A1 * | 11/2012 | Choi ............... H01L 21/4853 257/670 |
| 2013/0002285 | A1 * | 1/2013 | Nelson .............. G01R 1/06738 324/755.09 |
| 2013/0303002 | A1 * | 11/2013 | Oosterhuis ......... B29C 67/0062 439/49 |

* cited by examiner

ELECTRONIC MODULE WITH FREE-FORMED SELF-SUPPORTED VERTICAL INTERCONNECTS

FIELD OF INVENTION

The present invention relates generally to electronic modules, and more particularly to RF modules having free-formed, self-supported electrical interconnects.

BACKGROUND

Electronic modules, such as radio frequency (RF) modules, contain electronic components, such as high-frequency chipsets, that may take up a considerable amount of space inside the module and may generate a significant amount of heat. RF modules in a planar phased array antenna architecture are typically mounted on a base substrate and the available area for integrating such modules is often constrained. Typically, cooling is applied through the bottom of the module via a thermal mass or a restricted cold plate, which may interfere with RF operation due to the cold plate or thermal mass being in the direct path of electrical signals on the planar phased array antenna. As electronic components for RF modules become increasingly complex, there is a need to improve the available surface area for mounting such components, as well as improve the flexibility in electronic module design, while also enhancing the cooling to such components without interfering with RF/DC operation.

SUMMARY OF INVENTION

The present invention provides an electronic module, and method for making the electronic module, having free-formed, self-supported interconnect pillars that electrically connect electronic components on a cover substrate of the electronic module with electronic components on a base substrate of the electronic module.

The free-formed, self-supported interconnect pillars may provide for improved compactness of the electronic module by establishing an electrical path to the electronic components on the cover substrate, thereby effectively increasing the available area for mounting such electronic components. More particularly, the free-formed, self-supported interconnect pillars may extend vertically between the base electronic components and the opposing cover electronic components to provide a straight electrical path that allows sufficient spacing between the opposing electronic components. Such a configuration may enable improved thermal performance and cooling between components, and also limits or eliminates the use of substrate area for the interconnect path. In addition, by providing a straight and/or direct electrical path between electronic components, the configuration of the free-formed, self-supported interconnect pillars may also enable improved operational efficiency of the electronic module by reducing transmission losses of the electrical signal along the electrical path. Furthermore, the cover substrate may provide an integrated thermal spreader, which may be combined with a heat exchanger or thermal mass, to enhance cooling to the cover electronic components, while also minimizing interference with electrical connections or operations of the electronic device, such as the radio frequency (RF) or direct current (DC) operations.

The free-formed, self-supported interconnect pillars may be formed from an electrically conductive filament provided by a layer-wise additive manufacturing process. By depositing the electrically conductive filament, in situ, directly on the electronic components, the tailorability and flexibility in module design may be enhanced and the complexity of the interconnect structure may be reduced. For example, the free-formed, self-supported interconnect pillars may better accommodate for non-planarity between electronic components disposed on the substrates, and free-forming the self-supported interconnect pillars may improve the speed and cost to manufacture such electronic modules.

According to one aspect of the invention, a method for assembling an electronic module includes the steps: (i) mounting a base electronic component on a base substrate; (ii) mounting a cover electronic component on a cover substrate; (iii) depositing an electrically conductive filament directly on the base electronic component or directly on the cover electronic component; (iv) free-forming a self-supported interconnect pillar with the deposited electrically conductive filament, the free-formed, self-supported interconnect pillar extending upright from the base electronic component or the cover electronic component; (v) arranging the cover substrate over the opposing base substrate and aligning the base electronic component with the cover electronic component; and (vi) electrically connecting the base electronic component to the cover electronic component with the free-formed, self-supported interconnect pillar.

Embodiments of the invention may include one or more of the following additional features separately or in combination.

For example, the method for assembling the electronic module may further include the steps of attaching a compressible electrical interposer at a free-end of the free-formed, self-supported interconnect pillar, and electrically interposing the compressible electrical interposer in the electrical path between the respective free-formed, self-supported interconnect pillar and the base electronic component or the cover electronic component.

In some embodiments, the electrically conductive filament may be an electrically conductive paste.

The electrically conductive paste may be deposited to form the free-formed, self-supported interconnect pillar having a length to width aspect ratio of at least 3 to 1.

The cover electronic component and the base electronic component may each include an externally addressable face having an electrical contact surface, where the externally addressable face of the cover electronic component may be aligned with and opposingly face the externally addressable face of the base electronic component.

The electrically conductive paste may be deposited on the electrical contact surface of the base electronic component or may be deposited on the electrical contact surface of the cover electronic component and may form the free-formed, self-supported interconnect pillar in a straight path for electrically connecting with the opposing electrical contact surface of the base electronic component or the cover electronic component.

A plurality of the base electronic components may be mounted on the base substrate and a plurality of the cover electronic components may be mounted on the cover substrate, where at least one of the externally addressable faces of the plurality of cover electronic components is non-planar with respect to at least one other of the externally addressable faces of the plurality of cover electronic components, and/or at least one of the externally addressable faces of the plurality of base electronic components is non-planar with respect to at least one other of the externally addressable faces of the plurality of base electronic components.

The electrically conductive paste may be deposited on one or more of the plurality of base electronic components and/or one or more of the plurality of cover electronic components to form a plurality of the free-formed, self-supported interconnect pillars having varying longitudinal lengths for electrically connecting the plurality of base electronic components to the plurality of cover electronic components and to accommodate for the non-planarity of the respective externally addressable faces of the plurality of base electronic components and/or the plurality of cover electronic components.

The electrically conductive paste may be deposited to form the free-formed, self-supported interconnect pillar having a substantially cylindrical shape.

The electrical conductivity of the free-formed, self-supported interconnect pillar may be uniform through both a transverse cross-section and along a longitudinal length of the free-formed, self-supported interconnect pillar.

The electrical conductivity of the free-formed, self-supported interconnect pillar may be about $1 \times 10^7$ siemens per meter or greater.

The electrically conductive paste may be deposited through a layer-wise additive manufacturing process to form the free-formed, self-supported interconnect pillar.

Optionally, the electrically conductive paste may be deposited in a single extrusion step to form the at least one free-formed, self-supported interconnect pillar extending upright from the base electronic component or the cover electronic component.

The method for assembling the electronic module may further include the step of solidifying the electrically conductive paste.

The cover electronic component mounted on the cover substrate may generate more heat than the base electronic component mounted on the base substrate.

The method for assembling the electronic module may further include the steps of attaching a cold plate to the cover substrate, and cooling the cover electronic component.

The electronic module may be an RF module, and the free-formed, self-supported interconnect pillar may be configured to transmit RF or DC signals or transport heat.

A plurality of cover electronic components may be provided, which may include one or more monolithic microwave integrated circuits.

A plurality of base electronic components may be provided, which may include one or more application specific integrated circuits.

According to another aspect of the invention, an electronic module includes a base substrate, a base electronic component disposed on the base substrate, a cover substrate disposed over the base substrate, a cover electronic component disposed on the cover substrate, where the cover electronic component is spaced from the base electronic component, and a free-formed, self-supported interconnect pillar electrically connecting the base electronic component with the cover electronic component.

Embodiments of the invention may include one or more of the following additional features separately or in combination.

For example, the free-formed, self-supported interconnect pillar may be formed from an electrically conductive paste.

The cover electronic component and the base electronic component may each include an externally addressable face having an electrical contact surface, where the externally addressable face of the cover electronic component is parallel to and directly opposing faces the externally addressable face of the base electronic component.

The free-formed, self-supported interconnect pillar may extend between the respective electrical contact surfaces of the cover electronic component and the base electronic component.

The free-formed, self-supported interconnect pillar may have a length to width aspect ratio of at least 3 to 1 and may extend upright and perpendicular with respect to each of the externally addressable faces of the cover electronic component and the base electronic component.

The base substrate may include a plurality of the base electronic components, and the cover substrate may include a plurality of the cover electronic components.

A plurality of the free-formed, self-supported interconnect pillars may electrically connect the plurality of base electronic components to the respective plurality of cover electronic components.

In some embodiments, at least one of the externally addressable faces of the plurality of cover electronic components is non-planar with respect to at least one other of the externally addressable faces of the plurality of cover electronic components, and/or at least one of the externally addressable faces of the plurality of base electronic components is non-planar with respect to at least one other of the externally addressable faces of the plurality of base electronic components.

The free-formed, self-supported interconnect pillars may have varying longitudinal lengths to accommodate for the non-planarity of the respective externally addressable faces of the plurality of base electronic components and/or the plurality of cover electronic components.

The electronic module may further include cooling means, such as a heat exchanger or thermal mass, attached to the cover substrate.

The electronic module may be an RF module, where a plurality of cover electronic components may include one or more monolithic microwave integrated circuits, where a plurality of base electronic components may include one or more application specific integrated circuits, and where one or more of the plurality of free-formed, self-supported interconnect pillars may be configured to transmit RF or DC signals.

The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention.

FIGS. 2A-2F are cross-sectional views depicting exemplary process steps of assembling an exemplary electronic module according to the invention.

DETAILED DESCRIPTION

An electronic module, and method for making same, includes free-formed, self-supported interconnect pillars that electrically connect cover electronic components disposed on a cover substrate with base electronic components disposed on a base substrate. The free-formed, self-supported interconnect pillars may extend vertically in a straight path between the cover electronic components and the base electronic components. The free-formed, self-supported interconnect pillars may be formed from an electrically conductive filament provided by an additive manufacturing process.

The principles of the present invention have particular application to radio frequency (RF) electronic modules for wireless electronic devices, and thus will be described below chiefly in this context. It is also understood that principles of this invention may be applicable to other electronic modules where it is desirable to provide a three-dimensional architecture using free-formed, self-supported interconnect pillars that enable enhanced compactness, improved thermal and operational performance, and increased flexibility in design and manufacturing, among other considerations.

Figure 1:
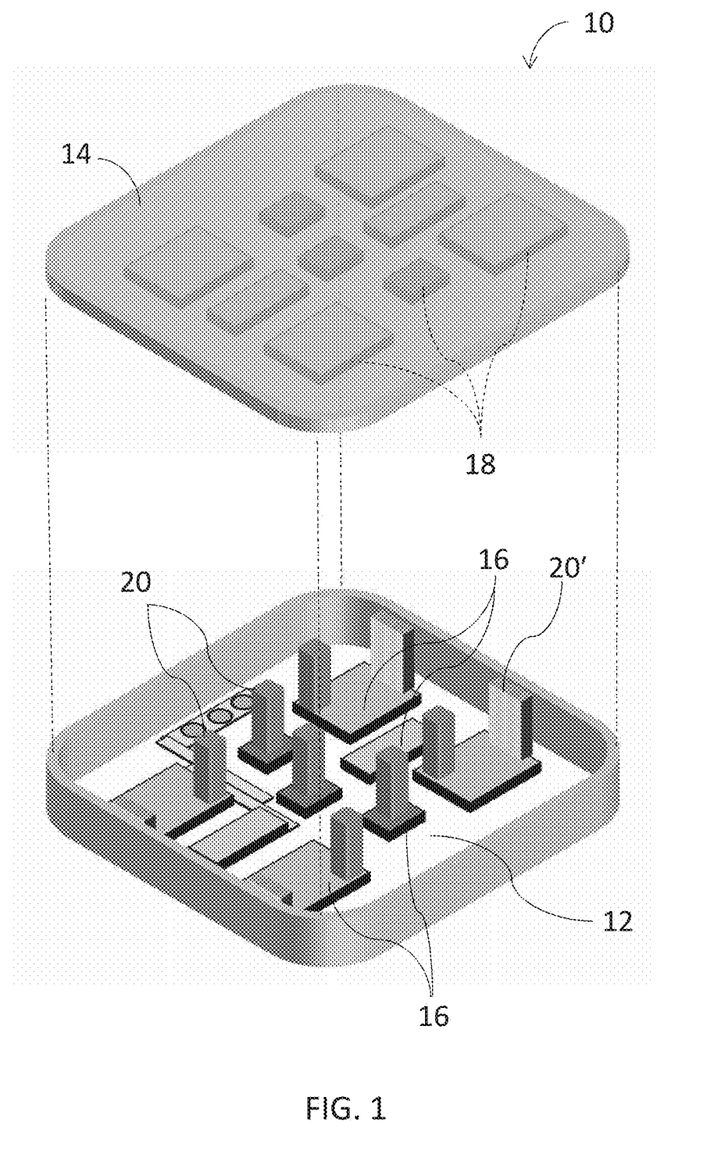
FIG. 1 is a perspective view of an exemplary electronic module according to the invention, where a cover substrate is shown removed from a base substrate.

FIG. 1 shows an exemplary electronic module 10 having a base substrate 12, or base, and a cover substrate 14, or lid, disposed over the base substrate 12. The base substrate 12 includes one or more base electronic components 16 disposed on the base substrate 12. The cover substrate 14 includes one or more cover electronic components 18 disposed on the cover substrate 14, which may be spaced from and/or opposingly face the base electronic components 16 (as shown in FIG. 2F, for example). One or more free-formed, self-supported interconnect pillars 20 extend upright between the base electronic components 16 and the cover electronic components 18 to provide an electrical path there between.

FIGS. 2A-2F illustrate an exemplary process of assembling and/or forming an exemplary electronic module 110. The electronic module 110 is substantially the same as, or similar to, the above-referenced electronic module 10, and consequently the same reference numerals but indexed by 100 are used to denote structures corresponding to the same or similar structures in the electronic module 10. In addition, the description relating to the electronic module 10 is equally applicable to the electronic module 110, and vice versa, except as noted below.

Figure 2A:
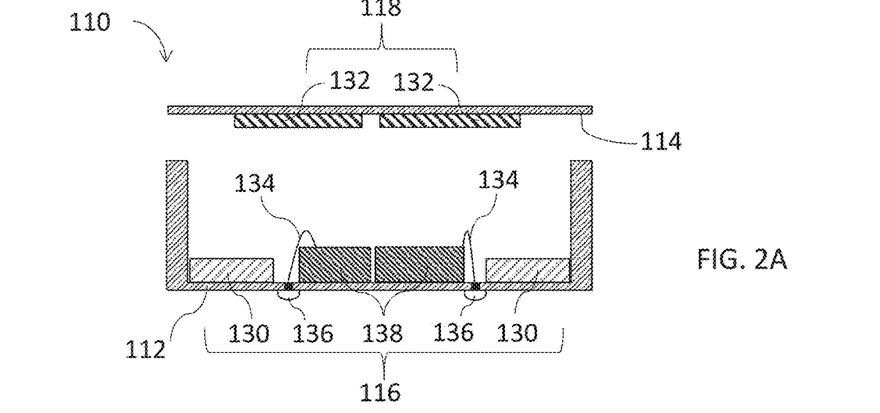
FIG. 2A depicts cover electronic components mounted to a cover substrate, and base electronic components mounted to a base substrate.

As shown in FIG. 2A, one or more base electronic components 116 are mounted on a base substrate 112. The base substrate 112 may include a metal base, semiconductor substrate, or may include conventional materials such as alumina, aluminum nitride, or similar ceramic according to conventional processes using conventional equipment, as is well known in the art. The base substrate 112 can include a single layer or multiple layers, including a dielectric layer and an insulating layer, formed using conventional processes and equipment.

The base electronic components 116 may be attached to the base substrate 112 in a suitable manner, for example, using electrically conductive or electrically non-conductive adhesives or solder. The base electronic components 116 may include integrated circuits, semiconductor chips, microelectronic devices, and/or various other active and passive electrical structures, such as capacitors, transistors, resistors, inductors, diodes, input/output interfaces, etc., which may be provided according to conventional practice. The base substrate 112 may also include other electrically conductive circuitry provided by traditional techniques in a well-known manner, such as wire bonding or photolithographic techniques, and the like.

Also shown in FIG. 2A, one or more cover electronic components 118 are mounted on a cover substrate 114, thereby effectively doubling the available area for mounting such components inside of the electronic module 110. The cover substrate 114 and the cover electronic components 118 may be the same as or substantially similar to the base substrate 112 and the base electronic components 116, respectively. As with the base substrate 112, the cover substrate 114 may include various integrated circuits, semiconductor chips, microelectronic devices, and/or other electrical circuitry and components, which may be provided according to conventional practice well-known in the art. The cover substrate 114 may also be sufficiently rigid to support the cover electronic components without distortion.

Generally, any type or number of electronic components 116, 118 can be attached to the cover substrate 114 and/or the base substrate 112. In a preferred embodiment, the electronic components 118 that generate the most heat are mounted to the cover substrate 114, which readily enables efficient transfer of the heat from the electronic components 118 to the exterior of electronic module 110. The cover substrate 114 may be provided as a thermal spreader, which may be combined with cooling means, such as a heat exchanger, to enhance cooling of the cover electronic components 118. The cover substrate 114 may also be configured to have a higher thermal conductivity than the base substrate 112 for more effectively cooling the high heat-generating components. For example, the cover substrate 114 may be made of, or include, an electrically non-conductive material having good thermal conductivity such as, for example, aluminum nitride; or the cover substrate 114 may be made of, or include, an electrically conductive material having good thermal conductivity, such as a molybdenum-copper alloy. Alternatively or additionally, the cover substrate 114 may be made of a material having relatively poor thermal conductivity, such as ceramic (e.g., alumina), and can incorporate a heat sink made of a thermally conductive material, such as metal, for example, copper-tungsten.

In the illustrated embodiment shown in FIG. 2A, the electronic module 110 is configured as an RF module 110 and may include application specific integrated circuits (ASICs) 130, monolithic microwave integrated circuits (MMICs) 132, other electronic components (e.g., capacitors and/or other integrated circuits 138), and/or other electronic circuitry (e.g., wires 134 and input/output interfaces 136) for generating, transmitting, and receiving RF signals. In a preferred embodiment, the cover electronic components 118 include the MMICs 132 which are mounted to the underside of the cover substrate 114, and the base electronic components 116 include the ASICs 130 and other components 138. Such a configuration enables more efficient cooling of the MM IC components 132 by providing the cover substrate 114 as a thermal spreader, which may optionally include cooling means 180 (shown in FIG. 2F), for example a thermal mass or heat exchanger (e.g., cold plate), that is mounted to the exterior surface of the cover substrate 114 opposite the MM IC components 132. Such a configuration may also reduce interference with RF operations by limiting obstructions with RF connections to the MMICs 132, and also by providing the cooling means 180 outside of the direct path of RF energy transferred through the front of the phased array antenna (e.g., toward the base substrate 112).

Figure 2B:
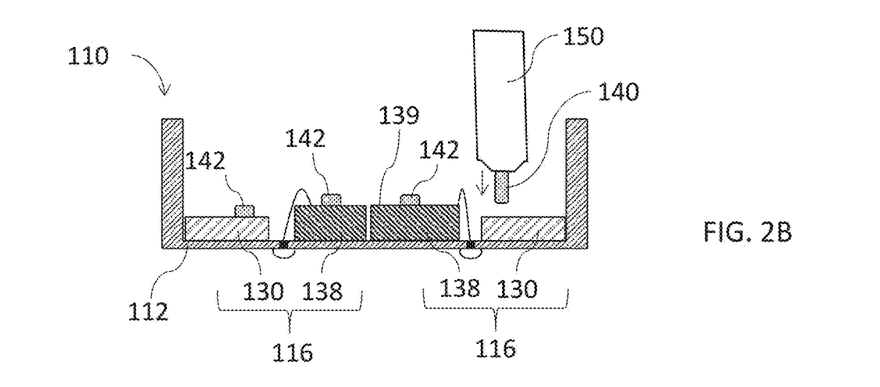
FIG. 2B depicts deposition of an electrically conductive filament through a nozzle to form independent layers of the filament on the base electronic components.
Figure 2C:
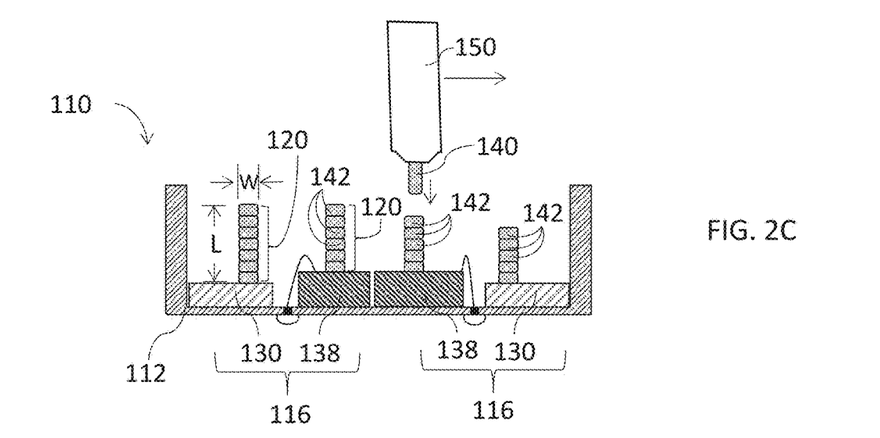
FIG. 2C depicts deposition of the electrically conductive filament to free-form self-supported interconnect pillars on the base electronic components.
Figure 2D:
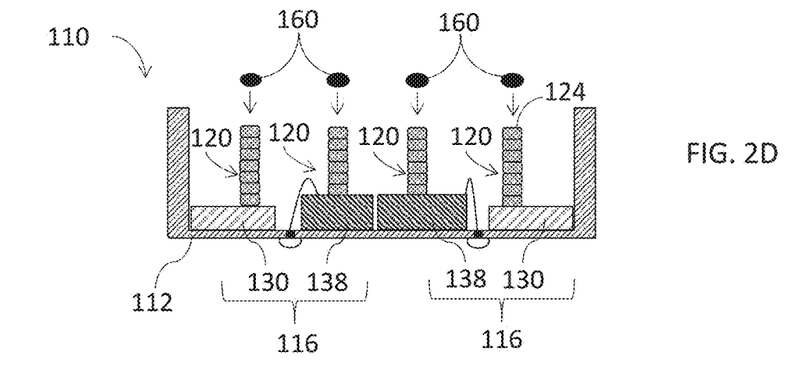
FIG. 2D depicts attachment of compressible interposers to free-ends of the free-formed, self-supported interconnect pillars.

Turning to FIGS. 2B and 2C, an exemplary process for producing one or more free-formed, self-supported interconnect pillars 120 (hereinafter also referred to as "interconnect pillars" 120) is shown. The free-formed, self-supported interconnect pillars 120 electrically connect the base electronic components 116 and the cover electronic components 118 to provide an electrical path therebetween. The term "electrically connect" as used herein may include either direct or indirect electrical connection between components e.g., 116, 118. It is understood that individual free-formed, self-supported interconnect pillars 120 may electrically connect individual electronic components 116, 118 at its opposite ends, and/or more than one interconnect pillar 120 may be disposed on a single electronic component 116, 118 to connect one or more opposite electronic components 116, 118. Although the interconnect pillars 120 are shown in the illustrated embodiment as being straight, they may also include a branching-type structure that provides for electrical connection of a single interconnect pillar 120 with multiple electronic components 116, 118 at one or more of the interconnect pillar ends. The interconnect pillars 120 may be perpendicular to the base electronic components 116 for electrically connecting with opposingly facing cover electronic components 118 that may be in direct alignment with the respective base electronic components 116. Alternatively or additionally, the interconnect pillars 120 may be inclined with respect to the base electronic components 116 for electrically connecting with opposingly facing cover electronic components 118 that may be in an offset alignment with the respective base electronic components 116.

The free-formed, self-supported interconnect pillars 120 may be configured to transmit a variety of electrical signals between the base electronic components 116 and cover electronic components 118. For example, where the electronic module 110 is configured as an RF module, the interconnect pillars 120 may be configured to communicate RF signals by receiving an RF input toward the base substrate 112 and transmitting an RF output toward the cover substrate 114, for example, to MMIC components 132. The interconnect pillars 120 may also be configured to transmit direct current (DC) between components, for example, from the ASICs 130 or other electronic components 138 (e.g., capacitors) disposed on the base substrate 112 to provide power and control to the MMICs 132 mounted on the cover substrate 114. In a preferred embodiment, the interconnect pillars 120 that are configured for RF operation (shown as RF pillars 20' in FIG. 1) are formed proximal the peripheral edges of the base substrate 112 and/or the cover substrate 114. In addition, the interconnect pillars 120 configured for RF operation may have a larger cross-sectional area for carrying more DC current without overheating. The interconnect pillar 120 may be configured with a suitable cross-sectional area depending on the current or RF power requirements to ensure reliable operation.

In the illustrated embodiment, the free-formed, self-supported interconnect pillars 120 are formed by depositing an electrically conductive filament 140 through a nozzle 150, or extrusion head, directly onto the base electronic components 116, such as the ASICs 130 and/or other electronic components 138, for example. The filament 140 may be deposited directly onto an electrical contact surface (not shown) provided on an externally addressable face (e.g., face 139) of the one or more base electronic components 116. Alternatively or additionally, the filament 140 may be deposited directly onto the cover electronic components 118 to form the interconnect pillars 120 in a similar manner, however, deposition and formation of the interconnect pillars 120 on the base electronic components 116 will primarily be shown and described for the purposes of simplicity.

In a preferred embodiment, the electrically conductive filament 140 is made of an electrically conductive paste, which may be deposited through a layer-wise additive manufacturing process to form the free-formed, self-supported interconnect pillar 120, as exemplified in FIGS. 2B and 2C. For example, the filament 140 may be deposited as a series of single layers 142, or traces, as the nozzle 150 moves across the substrate 112, such as from left to right as viewed in FIG. 2B. In this manner, the free-formed, self-supported interconnect pillar 120 may be formed layer 142 by layer 142, extending upright and away from the base electronic components 116, until the fully-formed interconnect pillar 120 reaches a desired dimension (shown in FIG. 2C, for example). The term "layer" as used herein means one or more levels, or of potentially patterned strata, and not necessarily a continuous phase. Optionally, the filament 140 may be solidified, such as through temperature treatment or air drying, before subsequent layers 142 are deposited. Alternatively or additionally, the filament 140 may be deposited in a single extrusion step to fully form the free-formed, self-supported interconnect pillar 120 extending upright from the base electronic component 116. For example, the filament 140 may be deposited on the base electronic component 116, and as the filament 140 continuously flows through the nozzle 150, the nozzle 150 may move away from the base component 116 (i.e., upward, as viewed in FIG. 2B) to free-form a single (e.g., cylindrical) self-supported interconnect pillar, or other non-layered interconnect structure extending upright and having a length greater than its width.

The additive manufacturing process for free-forming the self-supported interconnect pillar 120 may include methods such as Selective Laser Sintering (SLS), Stereolithography (SLA), micro-stereolithography, Laminated Object Manufacturing (LOM), Fused Deposition Modeling (FDM), MultiJet Modeling (MJM), direct-write, inkjet fabrication, and micro-dispense. Areas of substantial overlap can exist between many of these methods, which can be chosen as needed based on the materials, tolerances, size, quantity, accuracy, cost structure, critical dimensions, and other parameters defined by the requirements of the object or objects to be made.

Advantageously, the interconnect pillars 120 may be free-formed by depositing the filament 140, in situ, directly on the one or more electronic components 116, 118, and are therefore not formed in a mold or via path, nor subtractively machined or etched, nor preformed or prefabricated interconnect structures that must be subsequently attached to the electronic components 116, 118. Accordingly, the term "free-formed" as used herein includes formation of the interconnect pillars 120 in their unique intended position on the base electronic components 116 disposed on the base substrate 112 and/or the cover electronic components 118 disposed on the cover substrate 114, and not preformed or prefabricated into a predefined shape, nor subtractively machined or etched.

In addition, the free-formed interconnect pillars 120 may be deposited with the electrically conductive filament 140 such that the interconnect pillars 120 are self-supported structures capable of extending upright without the need for extraneous scaffolding that must subsequently be machined or etched away, and without the need for other support structures, such as via paths machined into the substrate, and the like. Accordingly, the term "self-supported" as used herein includes formation of the interconnect pillars 120 such that the interconnect pillar 120 may support itself independently along at least a majority of its longitudinal length, and preferably entirely unsupported along a length thereof.

Such a free-formed, self-supported interconnect pillar 120 may enhance tailorability in the electronic module 110 design and may also reduce the complexity of the interconnect structure. For example, as exemplified in FIG. 2C, by depositing the electrically conductive filament 140 in situ at unique intended positions on the base electronic components 116, the free-formed, self-supported interconnect pillars 120 may be formed with varying lengths (L) to better accommodate for the non-planarity of the externally addressable faces (e.g., 139) between electronic components 116, 118 that are electrically connected on opposite ends of the interconnect pillar 120. In this manner, the size and shape of each interconnect pillar 120 may be customized to match an individual topology not constrained by bulk manufacturing processes and tolerances. In addition, by depositing the electrically conductive filament 140 to free-form the self-supported interconnect pillars 120, inessential subtractive machining or etching steps may be reduced or eliminated. As such, the flexibility in design of such electronic modules 110 may be enhanced and the speed, cost, and yield to manufacture such electronic modules 110 may be improved.

A further advantage to providing the free-formed, self-supported interconnect pillars 120 in the manner described above is that such a configuration may enable improved compactness of the electronic module 110 by establishing an electrical path to the cover electronic components 118 disposed on the increased substrate area provided by the cover substrate 114. In addition, by providing the interconnect pillars 120 with sufficient length to adequately space the cover electronic components 118 from the base electronic components 116, the thermal performance of the electronic module 110 may be improved as the higher heat generating components may be adequately separated from lower heat generating components.

The free-formed, self-supported interconnect pillars 120 may also improve operational efficiency and reduce transmission losses of the electrical signals in the electronic module 110 by providing straight and/or predominately direct electrical paths between the respective electronic components 116, 118. For example, as shown in the exemplary embodiment of FIG. 2F, the externally addressable faces (e.g., 139) of the base electronic components 116 may be aligned with and opposingly face the externally addressable faces of the cover electronic components 118, such that the free-formed, self-supported interconnect pillars 120 may be formed perpendicularly and extend vertically with respect to the externally addressable faces (e.g., 139) of the respective electronic components 116, 118. Moreover, providing a straight and vertical path for the interconnect pillars 120 may reduce complexity in electronic module design and may limit or eliminate the use of substrate area that would otherwise be required for the interconnect path.

In a preferred embodiment, the free-formed, self-supported interconnect pillar 120 has a longitudinal length (L) that is greater than its transverse width (W) (or diameter). In particular, the length to width aspect ratio of the free-formed, self-supported interconnect pillar 120 is at least 2:1, preferably at least 3:1, more preferably 5:1, and optionally 8:1 or greater, including all ranges and subranges therebetween. Such a configuration of the free-formed, self-supported interconnect pillar 120 may provide adequate spacing for improved thermal performance and compactness, may improve operational efficiency and reduce transmission losses, and/or may enable the interconnect structure to be free-formed and self-supported for improved manufacturing efficiency. The higher aspect ratio may also enable a more dense interconnect structure, thereby requiring less MMIC 132 and/or ASIC 130 footprint.

Depending at least in part on the shape of the extrusion nozzle 150, the extruded filament 140 and/or the corresponding interconnect pillar 120 may in some embodiments have a substantially cylindrical shape. Because the extruded and deposited filament 140 may undergo a settling process, or in some cases a solidification process (for example, air-drying or thermal treatment, such as sintering or curing) after being deposited in the one or more layers 142 on the electronic module 116, the transverse cross-sectional shape of the interconnect pillar 120 may include some distortions from an exact circle. The interconnect pillar 120 may therefore be described as having a substantially cylindrical shape, which is defined herein as having a cylindrical shape or a distorted cylindrical shape. Alternatively or additionally, the filament 140 may be deposited from a nozzle 150 that does not have a circular cross-section; for example, the transverse cross-section of the nozzle may be rectangular, square, hexagonal, or other polygonal shape, in which case the transverse cross-sectional shape of the interconnect pillar 120 corresponds with the shape of the nozzle 150.

The electrically conductive filament 140 and/or the corresponding structure of the interconnect pillar 120 may have a diameter (or width, W) of from about 1 mil (25 microns) to about 100 mils (2.54 mm), more preferably from about 3 mils (76 microns) to 8 mils (203 microns), most preferably 6 mils (152 microns). The unsupported length (L) of the free-formed interconnect pillar 120, as measured along its longitudinal axis, may be from about 5 mils (127 microns) to about 500 mils (12.7 mm), more preferably about 10 mils (254 microns) to about 50 mils (1,270 microns), and most preferably about 30 mils (762 microns). As discussed above, the length (L) to width (W) (or diameter) aspect ratio of the free-formed, self-supported interconnect pillar 120 may be at least about 3:1, and more preferably about 5:1.

The electrically conductive filament 140, such as that made of an electrically conductive paste, may be designed with an appropriate chemistry and viscosity to enable the free-formed extrusion through the nozzle 150 and to provide the self-supported interconnect pillar structure. Preferably, the electrically conductive paste has thixotropic shear thinning behavior that enables the paste to be extruded through the nozzle 150 and yet be able to retain a self-supported shape of the deposited layer 142, or a self-supported shape of the entire interconnect pillar 120, after exiting the nozzle 150. In addition, it may be preferable that the electrically conductive paste has chemical compatibility and good wetting behavior with the electronic component 116, 118 and/or the electrical contact surface on the externally addressable face of the electronic component 116 or 118. Accordingly, the electrically conductive filament 140 and/or the free-formed interconnect pillar 120 may form a strong interface with the electronic component 116, 118 or the electrical contact surface thereof in the as-deposited state, as well as after any post-processing, such as thermal treatment, without compromising the structural integrity of the free-formed self-supported interconnect structure 120.

Due to the desired functionality of the free-formed, self-supported interconnect pillars 120, it may be preferred that the electrically conductive filament 140 and/or the corresponding interconnect pillar 120 exhibits a sufficiently high electrical conductivity. For example, the electrical conductivity of the filament 140 may be on the order of about $1 \times 10^7$ siemens per meter, preferably at least about $2.5 \times 10^7$ siemens per meter, and more preferably greater than $3 \times 10^7$ siemens per meter at standard temperature and pressure. The electrically conductive filament 140 may comprise an electrically conductive material, such as a transition metal, an alkali metal, an alkaline earth metal, a rare earth metal, or carbon. For example, the conductive material may include an electrically conductive material selected from the group consisting of: silver, copper, lead, tin, lithium, gold, platinum, titanium, tungsten, zirconium, iron, nickel, zinc, aluminum, magnesium, and carbon (e.g., graphite, graphene, carbon nanotubes).

Figure 2E:
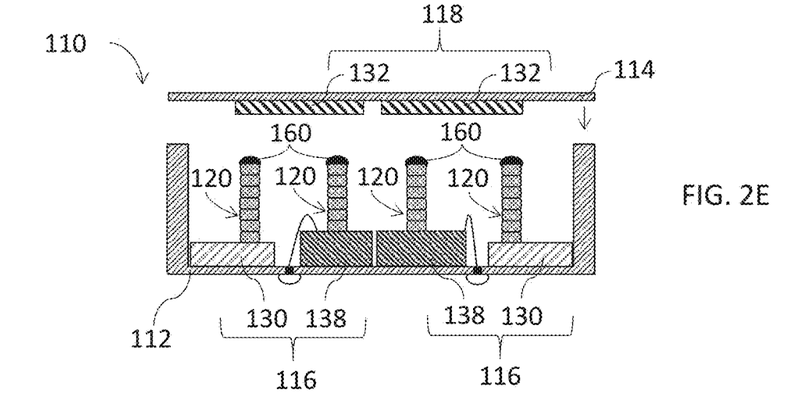
FIG. 2E depicts alignment and attachment of the cover substrate to the base substrate to electrically connect the cover electronic components to the base electronic components with the free-formed, self-supported interconnect pillars.
Figure 2F:
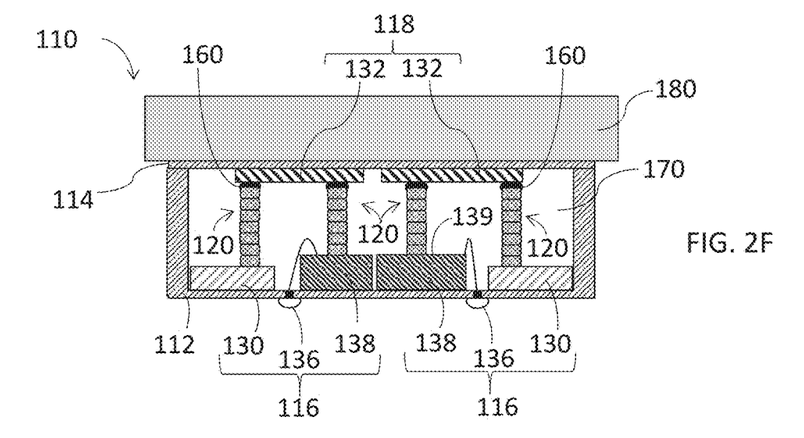
FIG. 2F depicts attachment of cooling means to the exterior surface of the cover substrate.

In addition, due to the interconnect pillar 120 being engaged at its opposite ends between the base substrate 112 and the cover substrate 114, and the electronic components 116, 118 thereof (as shown in FIG. 2E), it may be preferable that the interconnect pillar have sufficient compressive strength. It may also be preferred that the interconnect pillar 120 has a coefficient of thermal expansion similar to the module housing itself to limit compressive stresses from accumulating in the interconnect pillar 120 as the interconnect pillar 120 heats and expands due to heat generated by the electronic components 116, 118.

The free-formed, self-supported interconnect pillar 120 may preferably have a substantially uniform transverse cross-sectional width (W) (or diameter) along the entire unsupported length of the interconnect pillar 120, however, some distortions may occur due to settling or solidification of the deposited filament 140. It may also be preferable that the free-formed, self-supported interconnect pillar 120 has uniform material properties, such as electrical conductivity, through both its transverse cross-section and along its longitudinal length. Alternatively, the interconnect pillar 120 may be a functionally graded component having varying material properties for enabling modification or modulation of the electrical signal as required.

Figure 3:
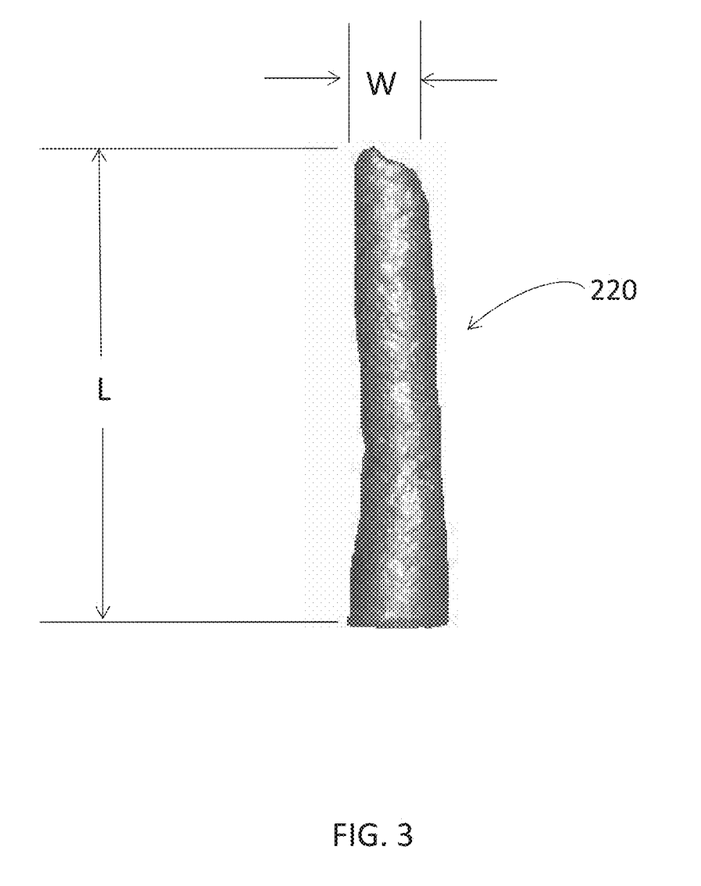
FIG. 3 is a photograph showing an exemplary free-formed, self-supported interconnect pillar according to the invention.

FIG. 3 shows a photograph of an exemplary free-formed, self-supported interconnect pillar 220 having a substantially cylindrical shape. The interconnect pillar 220 was made from a silver nanopaste that was deposited in a single vertical pass, or trace, extending away from the base. The height (or unsupported length, L) of the interconnect pillar 220 is about 29 mils (737 microns) and the width (W) (or diameter) is about 6 mils (152 microns), such that the length to width aspect ratio is about 5:1. The free-formed, self-supported interconnect pillar 220 has a relatively high electrical conductivity of about 85% that of the electrical conductivity of gold.

Turning now to FIG. 2D, after depositing the electrically conductive filament 140 and free-forming the self-supported interconnect pillars 120, the exemplary process of assembling the electronic module 110 may optionally include a step of attaching a compressible electrical interposer 160 at a free-end 124 of the free-formed, self-supported interconnect pillar 120. Accordingly, when the interconnect pillars 120 electrically connect the base electronic components 116 to the cover electronic components 118 (as shown in FIG. 2F), the compressible interposers 160 may be electrically interposed in the electrical path. In this manner, the interconnect pillars 120 may provide an electrical connection between the respective electronic components 116 and 118 that is indirect, yet the electrical path may still be provided as a straight path.

The electrical interposer 160 may have sufficient compliance or compressibility to accommodate for compressive engagement between the cover electronic component 114 and the free-end 124 of the interconnect pillar 120, which may reduce compressive stresses on the interconnect pillar 120. The compressible electrical interposer 160 may also have sufficient spring back to accommodate for slight variations in the overall height of the respective interconnect pillars 120 as the cover substrate 114 is attached to the base substrate 116, and as the cover electronic components 118 engage the compressible interposers 160 (as shown in FIGS. 2E and 2F, for example). The compressible electrical interposer 160 may also provide for improved contact area between the interconnect pillar 120 and the cover electronic component 118. In some embodiments, the compressible electrical interposer 160 may have approximately the same width (or diameter) as the interconnect pillar 120. The compressible electrical interposer 160 may provide low signal losses or distortion of the electrical signal between electronic components 116 and 118. In a preferred embodiment, the compressible electrical interposer 160 may constitute less than 20% of the length of the electrical path between electronic components 116 and 118 for reducing transmission losses.

The compressible electrical interposer 160 may be made from an electrically conductive elastomeric material, such as a silicon-based rubber having electrically conductive particles or fibers dispersed therein. Alternatively, the compressible electrical interposer 160 may be made from one or more electrically conductive wires, or filaments, compacted into a compressible interposer configuration, for example, cylindrical. The conductive wire or filaments of the interposer 160 may be made from gold-plated beryllium copper alloy (Au/BeCu) or a gold-plated molybdenum alloy (Au/Mo), for example.

Referring now to FIG. 2E, an exemplary process step of attaching the cover substrate 114 to the base substrate 112 to electrically connect the cover electronic components 118 with the base electronic components 116 via the interconnect pillars 120, and optionally the compressible interposers 160, is shown. In the illustrated embodiment, the cover substrate 114 is arranged over the base substrate 112, and the respective cover electronic components 118 are directly aligned with, and opposingly face, the base electronic components 116 to electrically connect with the vertical and straight interconnect pillars 120. As the cover substrate 114 is lowered to attach to the base substrate 112, the interposers 160 are compressed and simultaneously the cover substrate 114 may engage a hermetic seal member (not shown) on the base substrate 112 (or upright sidewalls of the base substrate 112) to form a hermetically sealed internal cavity 170 (shown in FIG. 2F) that prevents contaminants or moisture from entering the internal cavity 170. In this manner, all of the electronic components 116, 118 and electrical connections therebetween (e.g., interconnect pillars 120), with the exception of the input/output interfaces 136, for example, may be completely contained within the hermetically sealed internal cavity 170. The cover substrate 114 may be fixedly attached to the base substrate 112 with a laser weld or adhesive, for example an epoxy resin or solder, in a suitable manner well-known in the art.

In FIG. 2F, a cooling means 180 is shown attached to the exterior surface of the cover substrate 114 opposite the cover electronic components 118. The cooling means 180 may be a thermal mass, such as a block of steel, or a heat exchanger, such as a cold plate, a chiller, or a plate-fin heat exchanger. The cooling means 180 may be used to actively or passively cool the cover electronic components 118 by providing a direct path for thermal energy through the cover substrate 114. Preferably, the cover substrate 114 is configured to have a relatively high thermal conductivity for more effectively cooling the high heat-generating components. The cooling means 180 may be mounted and attached to the cover substrate 114 in a well-known manner using conventional methods, for example, with the use of adhesives, such as epoxy. The adhesive used for attaching the cooling means 180 may be configured to also have high thermal conductivity, for example, with the addition of thermally conductive additives.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method for assembling an electronic module comprising the steps:
    mounting a base electronic component on a base substrate;
    mounting a cover electronic component on a cover substrate;
    depositing an electrically conductive filament directly on the base electronic component or directly on the cover electronic component;
    free-forming a self-supported interconnect pillar with the deposited electrically conductive filament, the free-formed, self-supported interconnect pillar extending upright from the base electronic component or the cover electronic component;
    arranging the cover substrate over the opposing base substrate and aligning the base electronic component with the cover electronic component; and
    electrically connecting the base electronic component to the cover electronic component with the free-formed, self-supported interconnect pillar.

2. The method according to claim 1, further comprising the steps:
    attaching a compressible electrical interposer at a free-end of the free-formed, self-supported interconnect pillar; and
    electrically interposing the compressible electrical interposer in the electrical path between the respective free-formed, self-supported interconnect pillar and the base electronic component or the cover electronic component.

3. The method according to claim 1, wherein the electrically conductive filament is an electrically conductive paste.

4. The method according to claim 3, wherein the electrically conductive paste is deposited to form the free-formed, self-supported interconnect pillar having a length to width aspect ratio of at least 3 to 1.

5. The method according to claim 3, wherein the cover electronic component and the base electronic component each include an externally addressable face having an electrical contact surface;
    wherein the externally addressable face of the cover electronic component is aligned with and opposingly faces the externally addressable face of the base electronic component; and
    wherein the electrically conductive paste is deposited on the electrical contact surface of the base electronic component or is deposited on the electrical contact surface of the cover electronic component and forms the free-formed, self-supported interconnect pillar in a straight path for electrically connecting with the opposing electrical contact surface of the base electronic component or the cover electronic component.

6. The method according to claim 5,
    wherein a plurality of the base electronic components are mounted on the base substrate and a plurality of the cover electronic components are mounted on the cover substrate;
    wherein at least one of the externally addressable faces of the plurality of cover electronic components is non-planar with respect to at least one other of the externally addressable faces of the plurality of cover electronic components, and/or at least one of the externally addressable faces of the plurality of base electronic components is non-planar with respect to at least one other of the externally addressable faces of the plurality of base electronic components; and
    wherein the electrically conductive paste is deposited on one or more of the plurality of base electronic components and/or one or more of the plurality of cover electronic components to form a plurality of the free-formed, self-supported interconnect pillars having varying longitudinal lengths for electrically connecting the plurality of base electronic components to the plurality of cover electronic components and to accommodate for the non-planarity of the respective externally addressable faces of the plurality of base electronic components and/or the plurality of cover electronic components.

7. The method according to claim 3, wherein the electrically conductive paste is deposited to form the free-formed, self-supported interconnect pillar having a substantially cylindrical shape; and
    wherein the electrical conductivity is uniform through both a transverse cross-section and along a longitudinal length of the free-formed, self-supported interconnect pillar.

8. The method according to claim 7, wherein the electrical conductivity of the free-formed, self-supported interconnect pillar is $1 \times 10^7$ siemens per meter or greater.

9. The method according to claim 3, wherein the electrically conductive paste is deposited through a layer-wise additive manufacturing process to form the free-formed, self-supported interconnect pillar.

10. The method according to claim 3, wherein the electrically conductive paste is deposited in a single extrusion step to form the at least one free-formed, self-supported interconnect pillar extending upright from the base electronic component or the cover electronic component.

11. The method according to claim 3, further comprising the step of solidifying the electrically conductive paste.

12. The method according to claim 1, wherein the cover electronic component mounted on the cover substrate generates more heat than the base electronic component mounted on the base substrate.

13. The method according to claim 12, further comprising the steps:
attaching a cold plate to the cover substrate; and
cooling the cover electronic component.

14. The method according to claim 1, wherein the electronic module is an RF module, and the free-formed, self-supported interconnect pillar is configured to transmit RF or DC signals.

15. The method according to claim 14, wherein the cover electronic component is a monolithic microwave integrated circuit, and wherein the base electronic component is an application specific integrated circuit.

* * * * *